United States Patent
Chinthu et al.

(10) Patent No.: US 12,243,614 B2
(45) Date of Patent: Mar. 4, 2025

(54) SINGLE ENDED SENSE AMPLIFIER WITH CURRENT PULSE CIRCUIT

(71) Applicant: GlobalFoundries U.S. Inc., Malta, NY (US)

(72) Inventors: Siva Kumar Chinthu, Bangalore (IN); Suresh Pasupula, Bangalore (IN); Devesh Dwivedi, Bangalore (IN); Chunsung Chiang, San Jose, CA (US)

(73) Assignee: GlobalFoundries U.S. Inc., Malta, NY (US)

( * ) Notice: Subject to any disclaimer, the term of this patent is extended or adjusted under 35 U.S.C. 154(b) by 186 days.

(21) Appl. No.: 18/046,961

(22) Filed: Oct. 17, 2022

(65) Prior Publication Data

US 2024/0127868 A1 Apr. 18, 2024

(51) Int. Cl.
*G11C 7/06* (2006.01)
*G11C 7/10* (2006.01)
*G11C 7/12* (2006.01)

(52) U.S. Cl.
CPC .............. *G11C 7/067* (2013.01); *G11C 7/109* (2013.01); *G11C 7/12* (2013.01)

(58) Field of Classification Search
CPC ........... G11C 7/067; G11C 7/109; G11C 7/12; G11C 2207/063; G11C 7/065; G11C 7/08; G11C 7/14; G11C 11/1673; G11C 2013/0042; G11C 2013/0045; G11C 2013/0054; G11C 13/004
USPC .............................................. 365/191, 189.05
See application file for complete search history.

(56) References Cited

U.S. PATENT DOCUMENTS

| 1,029,776 | A | 6/1912 | Van Deursen | |
|---|---|---|---|---|
| 7,852,665 | B2 | 12/2010 | Chen et al. | |
| 11,222,678 | B1* | 1/2022 | Parkinson | H10B 61/22 |
| 11,798,936 | B2* | 10/2023 | Chang | H01L 27/0266 |
| 2006/0028894 | A1* | 2/2006 | Brennan | G11C 17/16 365/207 |
| 2008/0239599 | A1* | 10/2008 | Yizraeli | H02H 9/046 361/56 |

(Continued)

FOREIGN PATENT DOCUMENTS

| CN | 112531103 A | * | 3/2021 | ........... H01L 27/222 |
|---|---|---|---|---|
| JP | 6844475 B2 | * | 3/2021 | |

OTHER PUBLICATIONS

Zhang, Donglin et al.; "Sensing Circuit Design Techniques for RRAM in Advanced CMOS Technology Nodes"; Micromachines 2021, 12, 913; pp. 24; <https://www.mdpi.com/journal/micromachines>.

(Continued)

*Primary Examiner* — Michael T Tran
(74) *Attorney, Agent, or Firm* — David Cain; Hoffman Warnick LLC

(57) ABSTRACT

Embodiments of the disclosure provide memory circuit, a sense amplifier and associated method for reading a resistive state in a memory device. The sense amplifier includes a bit cell configurable to a high or low resistance state; a sensing circuit that detects a voltage drop across the bit cell in response to an applied read current during a read operation and generates a high or low logic output at an output node; and a pulse generation circuit that increases the applied read current with an injected current pulse when a low to high transition of the resistive state of the bit cell is detected.

19 Claims, 4 Drawing Sheets

(56) References Cited

U.S. PATENT DOCUMENTS

| | | | |
|---|---|---|---|
| 2011/0267723 A1* | 11/2011 | Stockinger | H01L 27/0285 |
| | | | 361/56 |
| 2012/0236650 A1* | 9/2012 | Nazarian | G11C 13/0007 |
| | | | 365/185.18 |
| 2013/0322154 A1 | 12/2013 | Youn et al. | |
| 2019/0051641 A1* | 2/2019 | Lee | H01L 21/563 |
| 2019/0325923 A1 | 10/2019 | Hoang et al. | |
| 2021/0150319 A1* | 5/2021 | Yu | G06N 3/08 |
| 2021/0233582 A1* | 7/2021 | Perroni | G11C 13/0028 |
| 2021/0247910 A1* | 8/2021 | Kim | G11C 7/1048 |
| 2021/0280243 A1* | 9/2021 | Miyazaki | G11C 13/0002 |
| 2021/0295888 A1* | 9/2021 | Osada | H10B 61/10 |
| 2022/0190037 A1* | 6/2022 | Verdy | H10N 70/821 |

OTHER PUBLICATIONS

Papaix, Caroline et al.; "A Single Ended Sense Amplifier for Low Voltage Embedded EEPROM Non Volatile Memories"; 2002 IEEE International Workshop on Memory Technology, Design and Testing (MTDT 2022); Copyright 2002 IEEE; 5 pages.

European Search Report dated Feb. 22, 2024 for Application No. 23192048.9; pp. 13.

* cited by examiner

SINGLE ENDED SENSE AMPLIFIER WITH CURRENT PULSE CIRCUIT

BACKGROUND

1. Technical Field

The present disclosure provides a circuit structure and related method to improve performance of a single ended sense amplifier.

2. Background Art

Typical memory device architectures include sense amplifiers for reading data stored in bit cells, e.g., by amplifying a voltage level in the bit cell and comparing it to a reference voltage to characterize the data as being a logic low (e.g., a "zero") or a logic high (e.g., a "one"). In certain memory device architectures, such as RRAM (resistive random-access memory) and MRAM (magnetoresistive random-access memory), resistive sense memory cells include variable resistors (referred to herein as "bit cells") that can be programmed during a write operation with either a high resistance or a low resistance. During a read operation, a single ended sense amplifier (hereinafter "sense amplifier") detects and amplifies the resistive state of the resistor and outputs a logic high or low.

SUMMARY

The illustrative aspects of the present disclosure are designed to solve the problems herein described and/or other problems not discussed.

Embodiments of the disclosure provides a memory circuit, comprising:
  a bit cell; a p-type metal-oxide semiconductor (PMOS) transistor having a drain connected to a data path of the bit cell; and a NAND gate having an output coupled to a gate of the PMOS device, wherein a first input of the NAND gate is controlled by a state of the bit cell.

Another aspect of the disclosure includes any of the preceding aspects, and wherein memory circuit is embodied in one of a resistive random-access memory (RRAM) or a magnetoresistive random-access memory (MRAM).

Another aspect of the disclosure includes any of the preceding aspects, and wherein a second input of the NAND gate is controlled by a pulse signal.

Another aspect of the disclosure includes any of the preceding aspects, and wherein the bit cell comprises a resistive sense memory cell.

Another aspect of the disclosure includes any of the preceding aspects, and wherein a source of the PMOS transistor is connected to a current source, and wherein the current source increases an applied read current to the data path with an injected current pulse in response to detection of a low to high transition of a resistive state of the bit cell.

In further aspects, the memory circuit includes a sensing circuit having a reference resistor.

In further aspects, the sensing circuit detects a voltage drop across the bit cell in response to an applied read current during a read operation and generates a high or low logic output at an output node of the sensing circuit.

In still further aspects, the pulse signal comprises an equalization start pulse and the state of the bit cell comprises a previous output logic value from the output node.

Another aspect of the disclosure includes any of the preceding aspects, and further includes an equalization start circuit that generates the equalization start pulse from an equalization start signal, wherein the equalization start pulse is approximately 3 nanoseconds in duration and the equalization start signal is approximately 10 nanoseconds in duration.

In certain aspects, the read operation includes: a pre-equalization phase during which the sense amplifier is in an off state; an equalization phase during which the current pulse is selectively injected to a bit cell line based on a previous output at the output node and the applied read current is provided to the bit cell and a reference resistor; and an execution phase during which a voltage drop across the bit cell is compared to a voltage drop across reference resistor to determine a present logic output at the output node.

Other embodiments of the disclosure provide a sense amplifier, including: a bit cell coupled to a sensing circuit via a data path; a p-type metal-oxide semiconductor (PMOS) transistor having a drain connected to the data path; and a NAND gate having an output coupled to a gate of the PMOS transistor, wherein a first input of the NAND gate is controlled by an output node of the sensing circuit.

Another aspect of the disclosure includes any of the preceding aspects, and wherein the sense amplifier is embodied in one of a resistive random-access memory (RRAM) or a Magnetoresistive random-access memory (MRAM).

Another aspect of the disclosure includes any of the preceding aspects, and wherein a second input of the NAND gate is controlled by a pulse signal.

Another aspect of the disclosure includes any of the preceding aspects, and wherein the pulse signal comprises an equalization start pulse and a state of the bit cell comprises a previous output logic value from the output node.

Other embodiments of the disclosure provide a method for implementing a sense amplifier, comprising: selectively applying a current pulse to a bit cell line based on a previous logic value maintained at an output node, the bit cell line coupled to a bit cell configurable to a high or low resistance state; applying a read current to the bit cell and a reference resistor; comparing a voltage drop across the bit cell (D1) to a voltage reference across the reference resistor (R1); and outputting a logic output at an output node based on a comparison of R1 and D1.

Another aspect of the disclosure includes any of the preceding aspects, and wherein the current pulse is applied when a low to high transition of the resistive state of the bit cell is detected.

Another aspect of the disclosure includes any of the preceding aspects, and wherein the current pulse is generated with a pulse generation circuit that includes a PMOS transistor that controls a current source.

Another aspect of the disclosure includes any of the preceding aspects, and wherein the pulse generation circuit further includes a NAND gate having an output that controls the PMOS transistor. In some aspects, the NAND gate has a first input for receiving an equalization start pulse and a second input for receiving a previous output state from the output node.

Another aspect of the disclosure includes any of the preceding aspects, and wherein the pulse generation circuit further includes an equalization start circuit that generates the equalization start pulse from an equalization start signal. In some aspects, the equalization start pulse is approximately 3 nanoseconds in duration and the equalization start signal is approximately 10 nanoseconds in duration.

Two or more aspects described in this disclosure, including those described in this summary section, may be combined to form implementations not specifically described herein.

The details of one or more implementations are set forth in the accompanying drawings and the description below. Other features, objects and advantages will be apparent from the description and drawings, and from the claims.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
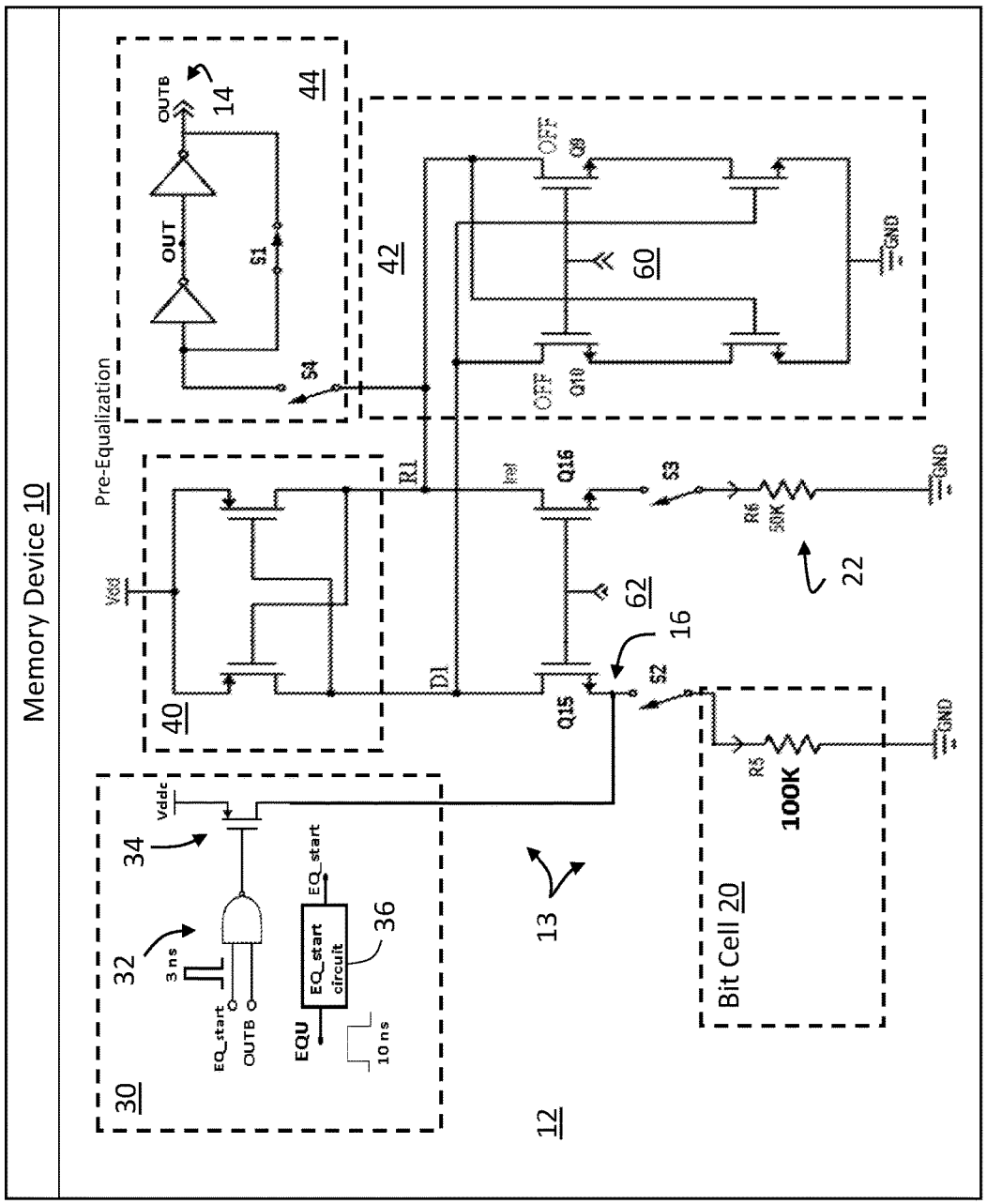
FIG. 1 shows a schematic diagram of a sense amplifier in a pre-equalization phase according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Aspects of the present disclosure provide an enhanced single ended sense amplifier for a memory device, such as an RRAM or MRAM, that utilizes a resistive sense memory cell ("bit cell") structure. The enhanced sense amplifier improves performance, e.g., by allowing read operations to be performed in a single clock cycle. As noted, RRAM devices and the like utilize bit cells that can be configured to have different electrical resistances to store different logic states. The resistance of the bit cells is detected during a read operation using a single ended sense amplifier that applies a read current and senses a voltage level associated with a voltage drop across the cell. Existing approaches generally require the use of two clock cycles to complete the read operation, which is a result of the slower speeds needed to process low to high data transitions. In particular, charging, sensing and decoding voltage drops across high bit cell resistances, e.g., 100 Kiloohms (kW), can require more than a single clock cycle using existing techniques when a previous resistive state was low, e.g., 10 kΩ.

In certain aspects, the present disclosure includes an enhancement to a sense amplifier that provides a parallel current path for the bit cell, which is activated during the initial read (i.e., "equalization") phase to reduce the charging time of the bit cell resistor required during low to high data transitions. In further aspects, the additional circuit component utilizes a masking technique to differentiate between low to high and high to low transitions. This masking technique ensures that the additional current is not injected when the previous resistive state was high.

Figure 2:
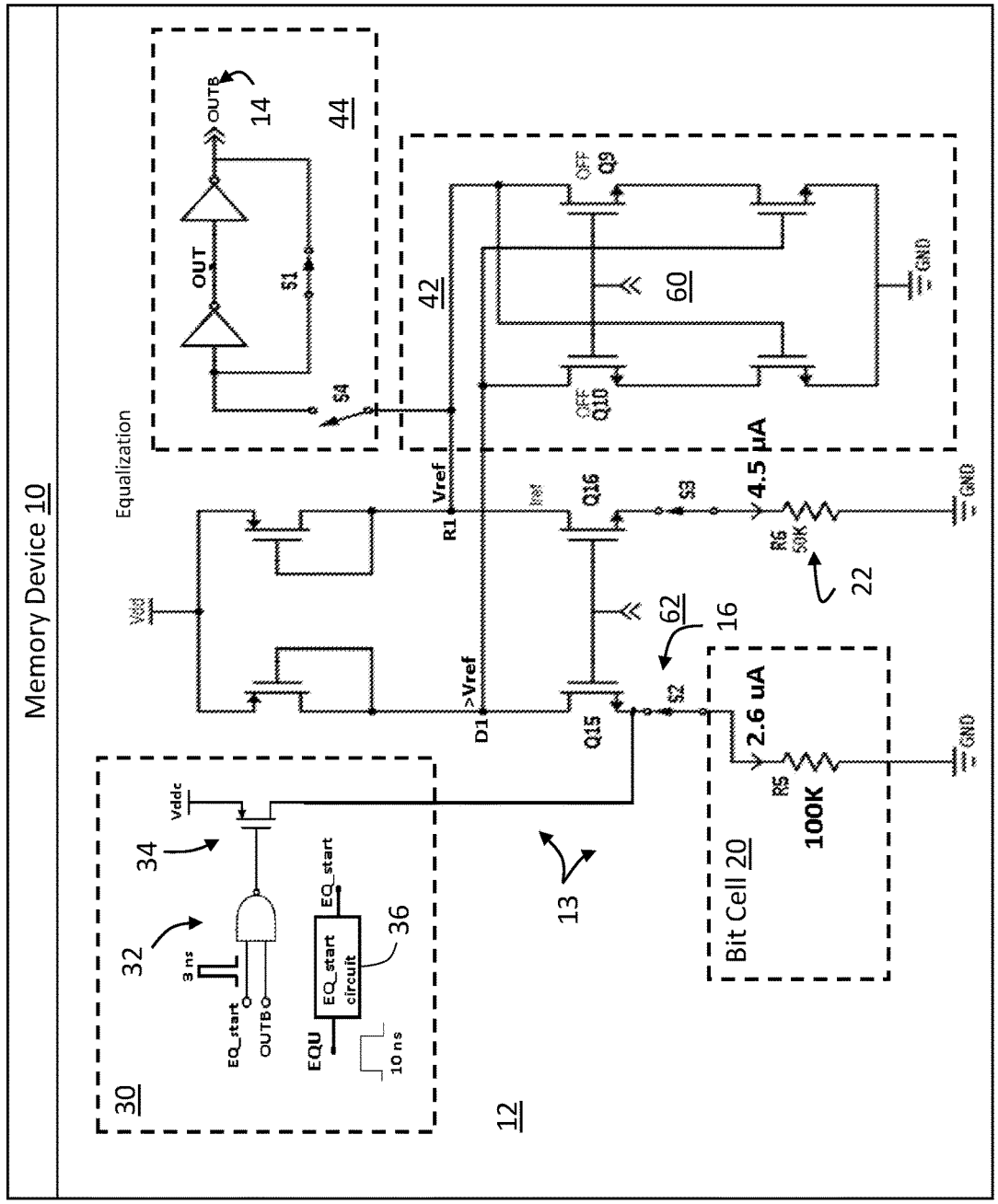
FIG. 2 shows a schematic diagram of a sense amplifier in an equalization phase according to embodiments of the disclosure.
Figure 3:
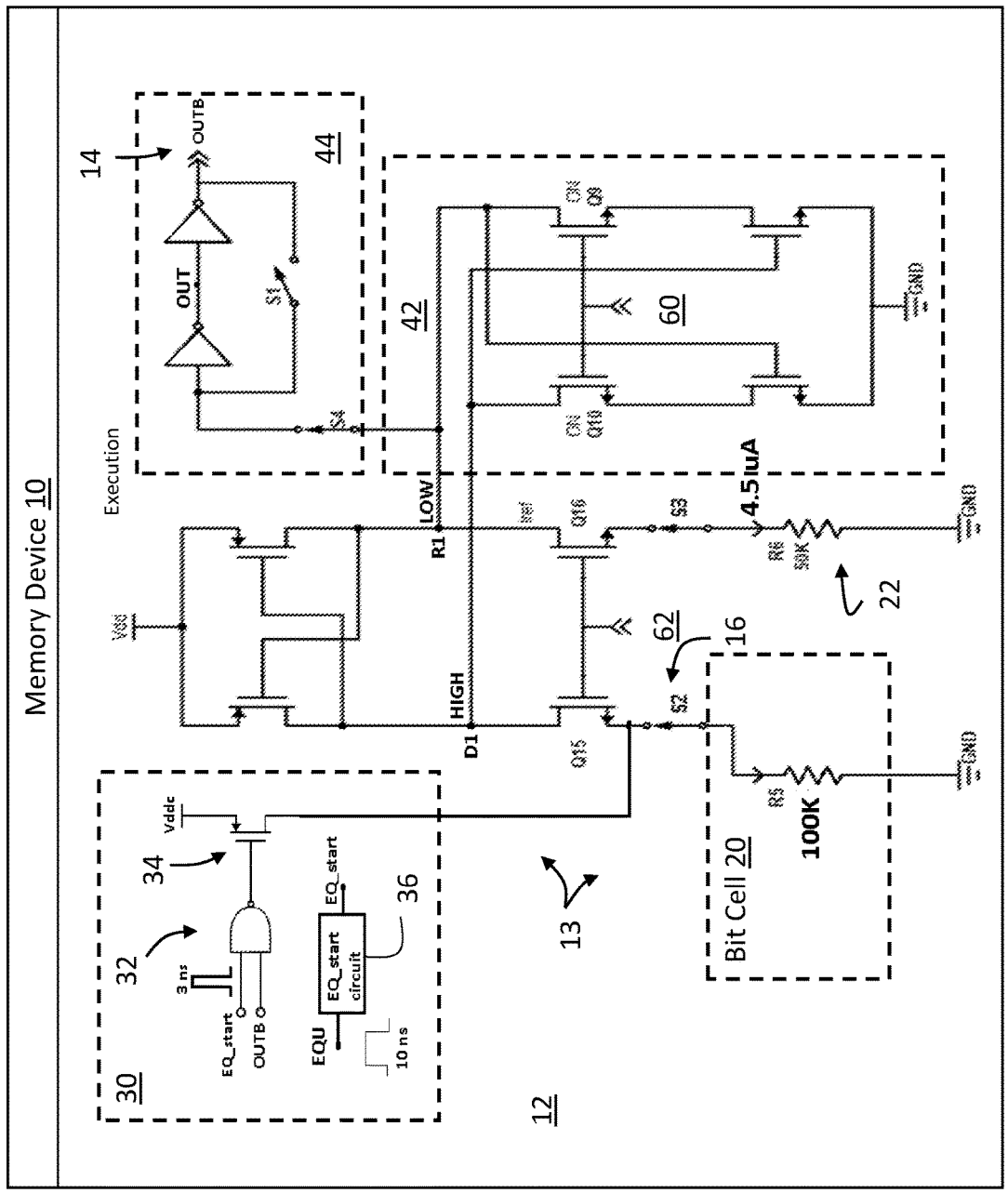
FIG. 3 shows a schematic diagram of a sense amplifier in an execution phase according to embodiments of the disclosure.

FIGS. 1-3 depict an illustrative sense amplifier 12 that includes: (1) a bit cell 20; (2) a single ended sensing circuit 13; and (2) a pulse generation circuit 30. As described in further detail herein, pulse generation circuit 30 provides a parallel current path that enhances performance by selectively injecting additional current to bit cell line 16 (i.e., data path of the bit cell) above switch S2. As shown, sense amplifier 12 is embedded in a memory device 10, such as an RRAM or MRAM, configured to store and retrieve data in bit cells 20. Although only a single iteration is shown, it is understood that a typical memory device 10 includes many bit cells 20 and sense amplifiers 12, as well as other components such as controllers, logic, multiplexors, ECC decoders, etc., which are not shown but are readily understood by one skilled in the art. For example, U.S. Pat. No. 7,852,665. Memory Cell with Proportional Current Self-Reference Sensing, issued on Dec. 14, 2010, further describes such features, and is hereby incorporated by reference.

As generally shown in FIG. 1, sense amplifier 12 is configured to sense the resistive value of bit cell 20 and output logic values at output nodes OUT and OUTB. Resistance of the bit cell 20 is detected by applying a read current from Vdd across the bit cell 20 and reference resistor 14 (e.g., 50 kΩ) to obtain a sensed data voltage drop (D1) and reference voltage drop (R1). The values at D1 and R1 are then compared to determine a logic value, e.g., if D1 is less than R1, the logic value is 0 and if D1 is greater than R1, the logic value is 1. In this illustrative embodiment, sense amplifier 12 includes: a latch 40 that stores values for D1/R1 and together with component 42 provides circuitry for comparing values D1/R1; and an output component 44 for outputting a sensed logic value based on the comparison of D1 and R1. A pair of additional p-type metal-oxide semiconductor (PMOS) transistors Q15 and Q16, which limit the voltage/current across the bit cell during equalization phase are controlled by an input signal 62.

A typical read operation of sense amplifier 12 can be described in three phases, referred to and shown herein as "pre-equalization" (FIG. 1). "equalization" (FIG. 2), and "execution" (FIG. 3). In the pre-equalization phase (FIG. 1), switches S2, S3 and S4 are open, and switch S1 is closed. In this phase, internal nodes D1/R1 maintain the charge of the prior read operation and output component 44 maintains the logic state of prior read operation (0 or 1) in complementary OUT and OUTB nodes. During this phase, all the switches are open except S1. Signal 60, which controls transistors Q9 and Q10, goes LOW turning off transistors Q9 and Q10. In this phase, bit cell 20 and reference resistor 22 are not connected; therefore, there is no current path from Vdd to ground.

In the equalization phase (FIG. 2), switches S2 and S3 are closed completing the circuit between Vdd and ground via both the bit cell 20 and reference resistor 22, which causes the bit cell resistor R5 and reference resistor R6 22 to be charged. In the case where bit cell resistor R5 is currently at a high resistive state, e.g., 100 kΩ, node D1 will be supplied with a voltage greater than the reference voltage (Vref) at node R1. If bit cell resistor R5 is currently at a low resistive state, e.g., 10 kΩ, node D1 will have a voltage less than the reference voltage (Vref) at node R1. Because switch S4 remains open during this phase, the output component 44 continues to maintain the logic state of a prior read operation in complementary OUT and OUTB nodes.

In the execution phase (FIG. 3), switch S4 is closed and switch S1 is opened, causing compare components 40 and 42 to decode the value stored in bit cell 20. Components 40 and 42 compare currents created by a drop across the bit cell 20 and reference resistor 22. Component 42 is activated by signal 60, which is an execution signal that is high only in the execution phase (e.g., a 1 ns to 2.4 ns period) to activate transistors Q9 and Q10, to provide either a low or high logic value to output component 44. In the case where D1 is HIGH and R1 is LOW as shown, a logic 1 is output at OUT and its complement 0 is output at OUTB. In the case where D1 is LOW and R1 is HIGH, a logic 0 is provided to OUT and its complement 1 is provided at OUTB.

As noted, if the previous state of bit cell 20 was low (i.e., OUT was 0 and resistance of bit cell resistor R5 was low, e.g., 10 kΩ), and the new state is high (i.e., resistance of R5 is 100 kΨ), the amount of time it takes to charge the bit cell 20 during the equalization phase (FIG. 2) is significantly higher than if the prior state was high because the current at bit cell resistor R5 is relatively low, e.g., only at about 2.6 μA. The additional time required to charge the bit cell 20 introduces a certain amount of latency into the read operation and, e.g., limits the ability to perform read operations in a single clock cycle.

To address this issue, pulse generation circuit 30 provides a parallel current path to inject a current pulse during the equalization phase (FIG. 2) to raise the current at the bit cell line 16 above switch S2 when a transition from low to high occurs. This quickly charges line 16 and results in a shorter amount of time required to charge bit cell 20 and, e.g., allows the read operation to complete in a single clock cycle.

In this illustrative embodiment, pulse generation circuit 30 generally includes: (1) an equalization start circuit 36 that receives the equalization start signal (e.g., a 10 nanosecond signal) and outputs a shortened pulse signal of about 3 nanoseconds; (2) a NAND gate 32 that receives the pulse signal and the value at OUTB 14 (i.e., the logic state of the prior read operation); and (3) a p-type metal-oxide semiconductor (PMOS) transistor 34 that is gated, i.e., controlled, by the output of the NAND gate 32. When the PMOS transistor 34 is activated, i.e., has a low input from NAND gate 32 due to a high state at OUTB (indicating a prior low logic output) and a pulse signal, a pulse current from Vddc is injected to the bit cell line 16. Note that this particular pulse generation circuit 30 will generate the pulse current to bit cell line 16 during both low to high and low to low transitions. Low to low transitions will however have negligible impact since the time it takes to charge bit cell 20 will not be an issue during low to low transitions. Pulse generation circuit 30 will however not inject a current pulse during high to low or high to high transitions due to the masking effect implemented by NAND gate 32. It is understood that alternative pulse generation circuits that perform a similar function could be implemented.

Figure 4:
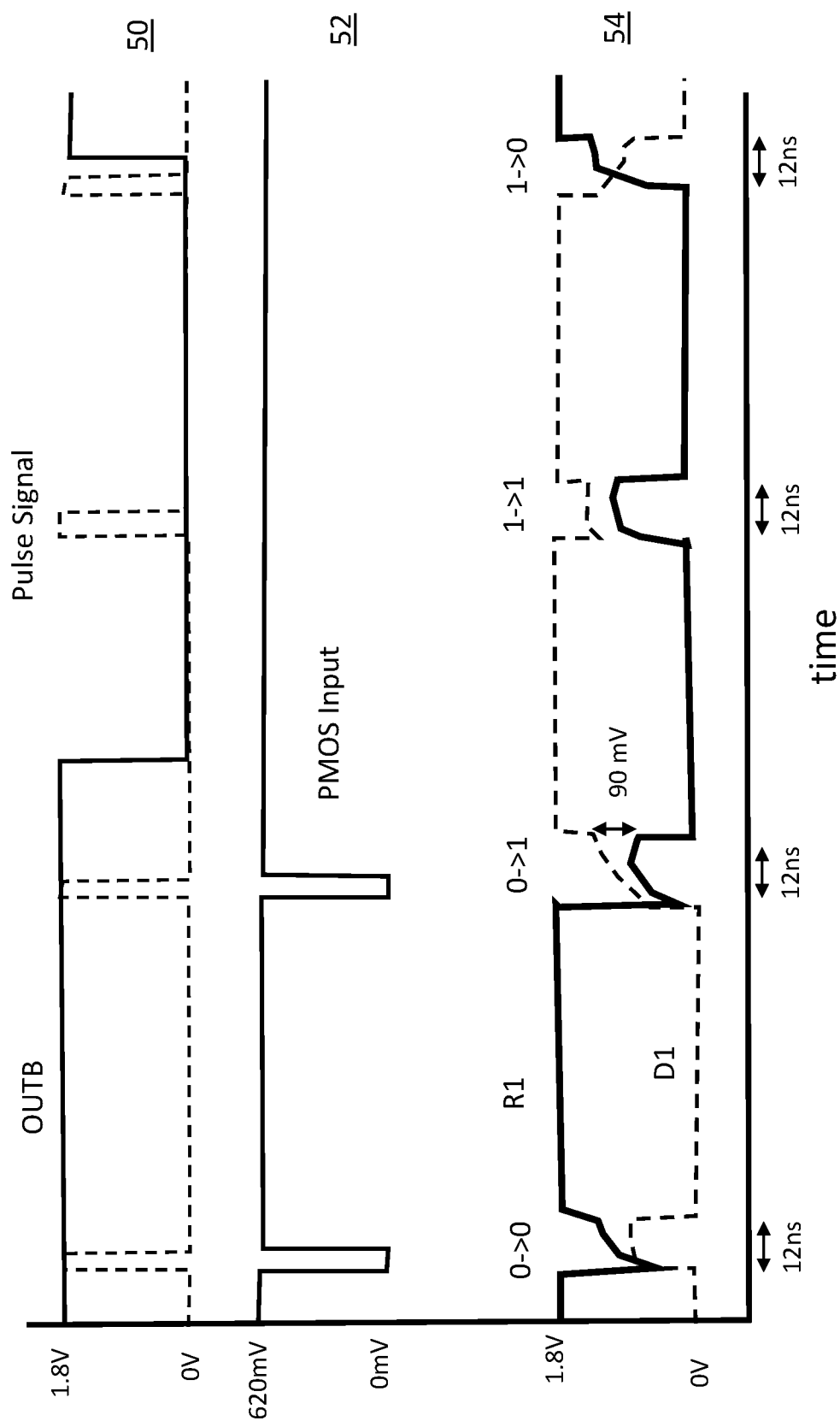
FIG. 4 shows a timing diagram of a pulse generation circuit according to embodiments of the disclosure.

FIG. 4 depicts a timing diagram that shows the operation of pulse generation circuit 30. The top diagram 50 shows the inputs to NAND gate 32. i.e., OUTB and the pulse signal. The middle diagram 52 shows the PMOS transistor 34 input from the NAND gate 32 output. When the PMOS transistor 34 is activated (i.e., input is low), an additional current pulse is injected at a low to low and a low to high transaction as described above. As can be seen in the bottom diagram 54, the transition time from a low to high (i.e., 0→1) transition at D1 (and opposite at R1) remains at about 12 nanoseconds (ns), the same as the other transitions. In the example shown, in the transition from low to high, a spread of about 90 mV is attained within 12 ns, which is adequate to indicate that the bit cell 20 is in the high state, e.g., 100 kΩ. A typical threshold voltage difference between nodes D1 and R1 to indicate a high state may, for example, include any voltage greater than 80 mV.

In a typical 40 MI-z system that utilizes a 10 ns ECC decode time and 25 ns clock period, there is adequate time in a single clock cycle to both sense and decode the bit cell 20 value when the injected current pulse is provided by pulse generation circuit 30. Without the pulse generation circuit 30, the transition from low to high would, for example, take closer to 18 ns. Accordingly, in the same 40 MHz system that does not inject a current and utilizes a 10 ns ECC decode time, a total of 28 ns would be required, which exceeds the 25 ns time period of the clock cycle, thus requiring two clock cycles totaling 50 ns.

The method and structure as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a center processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A memory circuit, comprising:
   a bit cell having a resistor configurable to a low resistive state and a high resistive state;
   a p-type metal-oxide semiconductor (PMOS) transistor having a drain connected to a data path of the bit cell; and
   a NAND gate having an output coupled to a gate of the PMOS device, wherein a first input of the NAND gate is controlled by a state of the bit cell;
   wherein the memory circuit is embodied in one of a resistive random access memory (RRAM) or a Magnetoresistive random-access memory (MRAM).

2. The memory circuit of claim 1, wherein a second input of the NAND gate is controlled by a pulse signal.

3. The memory circuit of claim 2, wherein the bit cell comprises a resistive sense memory cell.

4. The memory circuit of claim 3, wherein a source of the PMOS transistor is connected to a current source, and wherein the current source increases an applied read current to the data path with an injected current pulse in response to detection of a low to high transition of a resistive state of the bit cell.

5. The memory circuit of claim 4, further comprising a sensing circuit having a reference resistor.

6. The memory circuit of claim 5, wherein the sensing circuit detects a voltage drop across the bit cell in response to an applied read current during a read operation and generates a high or low logic output at an output node of the sensing circuit.

7. The memory circuit of claim 6, wherein the pulse signal comprises an equalization start pulse and the state of the bit cell comprises a previous output logic value from the output node.

8. The memory circuit of claim 7, further comprising an equalization start circuit that generates the equalization start pulse from an equalization start signal, wherein the equalization start pulse is approximately 3 nanoseconds in duration and the equalization start signal is approximately 10 nanoseconds in duration.

9. The memory circuit of claim 6, wherein the read operation includes:
   a pre-equalization phase during which the sensing circuit is in an off state;
   an equalization phase during which the current pulse is selectively injected to the data path of the bit cell based on a previous output at the output node and the applied read current is provided to the bit cell and a reference resistor; and
   an execution phase during which a voltage drop across the bit cell is compared to a voltage drop across the reference resistor to determine a present logic output at the output node.

10. A sense amplifier, comprising:
    a bit cell coupled to a sensing circuit via a data path, wherein the bit cell includes a resistor configurable to a low resistive state and a high resistive state;
    a p-type metal-oxide semiconductor (PMOS) transistor having a drain connected to the data path; and
    a NAND gate having an output coupled to a gate of the PMOS transistor, wherein a first input of the NAND gate is controlled by an output node of the sensing circuit.

11. The sense amplifier of claim 10, wherein the sense amplifier is embodied in one of a resistive random-access memory (RRAM) or a Magnetoresistive random-access memory (MRAM).

12. The sense amplifier of claim 10, wherein a second input of the NAND gate is controlled by a pulse signal.

13. The sense amplifier of claim 12, wherein the pulse signal comprises an equalization start pulse and a state of the bit cell comprises a previous output logic value from the output node.

14. A method for implementing a sense amplifier, comprising:
- selectively injecting a current pulse to a bit cell line based on a previous logic value maintained at an output node, the bit cell line coupled to a bit cell that is configurable to a high or low resistance state;
- applying a read current to the bit cell and a reference resistor;
- comparing a voltage drop across the bit cell (D1) to a voltage reference across the reference resistor (R1); and
- outputting a logic output at the output node based on a comparison of R1 and D1.

15. The method of claim 14, wherein the current pulse is injected when a low to high transition of the resistive state of the bit cell is detected.

16. The method of claim 15, wherein the current pulse is generated with a pulse generation circuit that includes a p-type metal-oxide semiconductor (PMOS) transistor that controls a current source.

17. The method of claim 16, wherein the pulse generation circuit further includes a NAND gate having an output that controls the PMOS transistor.

18. The method of claim 17, wherein the NAND gate has a first input for receiving an equalization start pulse and a second input for receiving a previous output state from the output node.

19. The method of claim 18, wherein the pulse generation circuit further includes an equalization start circuit that generates the equalization start pulse from an equalization start signal.

* * * * *